(12) United States Patent
Martin et al.

(10) Patent No.: US 7,053,491 B2
(45) Date of Patent: May 30, 2006

(54) ELECTRONIC ASSEMBLY HAVING COMPOSITE ELECTRONIC CONTACTS FOR ATTACHING A PACKAGE SUBSTRATE TO A PRINTED CIRCUIT BOARD

(75) Inventors: Edward L. Martin, Chandler, AZ (US); L. Todd Biggs, Queen Creek, AZ (US)

(73) Assignee: Intel Corporation, Santa Clara, CA (US)

( * ) Notice: Subject to any disclaimer, the term of this patent is extended or adjusted under 35 U.S.C. 154(b) by 110 days.

(21) Appl. No.: 10/068,494

(22) Filed: Feb. 4, 2002

(65) Prior Publication Data
US 2003/0146505 A1 Aug. 7, 2003

(51) Int. Cl.
*H01L 23/48* (2006.01)

(52) U.S. Cl. .............. 257/782; 257/778; 257/738; 257/772; 257/779; 257/780; 257/777; 257/730

(58) Field of Classification Search .............. 257/777, 257/778, 779, 780, 782, 738, 723, 730, 692
See application file for complete search history.

(56) References Cited

U.S. PATENT DOCUMENTS

| | | | |
|---|---|---|---|
| 3,303,393 A | | 2/1967 | Hymes et al. |
| 5,801,446 A | * | 9/1998 | DiStefano et al. .......... 257/778 |
| 5,841,198 A | | 11/1998 | Chia et al. |
| 5,931,371 A | * | 8/1999 | Pao et al. .............. 228/180.22 |
| 6,002,168 A | * | 12/1999 | Bellaar et al. .............. 257/696 |
| 6,087,597 A | | 7/2000 | Shimada et al. |
| 6,184,062 B1 | * | 2/2001 | Brofman et al. ............ 438/106 |
| 6,271,111 B1 | | 8/2001 | Farooq et al. |
| 6,283,359 B1 | | 9/2001 | Brofman et al. |
| 6,300,578 B1 | | 10/2001 | Hoffmeyer et al. ......... 174/263 |
| 6,303,408 B1 | * | 10/2001 | Smith ........................ 438/106 |
| 6,324,754 B1 | * | 12/2001 | DiStefano et al. ............ 29/840 |
| 6,465,747 B1 | * | 10/2002 | DiStefano et al. .......... 174/261 |
| 2001/0015495 A1 | * | 8/2001 | Brofman et al. ............ 257/734 |
| 2002/0041036 A1 | * | 4/2002 | Smith ........................ 257/778 |

* cited by examiner

*Primary Examiner*—Nathan J. Flynn
*Assistant Examiner*—Fazli Erdem
(74) *Attorney, Agent, or Firm*—Blakely, Sokoloff, Taylor & Zafman LLP

(57) ABSTRACT

Electronic contacts, including spherical cores and attachment layers on the cores, are provided for attaching a semiconductor package substrate to a printed circuit board. The spherical cores are made of high-melting-temperature copper, and the attachment layers are made of a low-melting-temperature eutectic. The attachment layers melt in a reflow process. The spherical cores do not melt, and thereby control movement or "collapsing" of the package substrate toward the printed circuit board.

21 Claims, 3 Drawing Sheets

FLIP

HEAT AND COOL

ELECTRONIC ASSEMBLY HAVING COMPOSITE ELECTRONIC CONTACTS FOR ATTACHING A PACKAGE SUBSTRATE TO A PRINTED CIRCUIT BOARD

BACKGROUND OF THE INVENTION

1). Field of the Invention

This invention relates to an electronic assembly of the kind having a semiconductor package substrate which is attached to a printed circuit board.

2). Discussion of Related Art

A semiconductor die having an integrated circuit formed therein is often mounted on top of a package substrate. The integrated circuit is electrically connected through contact pads on an upper surface of the package substrate and metal lines in the package substrate to contact pads on the lower surface of the package substrate. A respective solder ball is attached to a respective one of the contact pads on the lower surface of the package substrate. The solder balls are located in an array in a horizontal plane.

The solder balls are subsequently located on contact terminals on an upper surface of a printed circuit board. The solder balls are then heated to above their melting temperature, so that they reflow over the contact terminals on the printed circuit board. Subsequent cooling and solidification of the solder balls secures them to the contact terminals.

The package substrate usually collapses toward the printed circuit board when the solder balls reflow. There has in the past been no need to minimize such collapsing, because collapsing did not directly influence structural or electrical cooperation between the printed circuit board and the package substrate.

BRIEF DESCRIPTION OF THE DRAWINGS

The invention is described by way of examples with reference to the accompanying drawings, wherein.

DETAILED DESCRIPTION OF THE INVENTION

Figure 1:
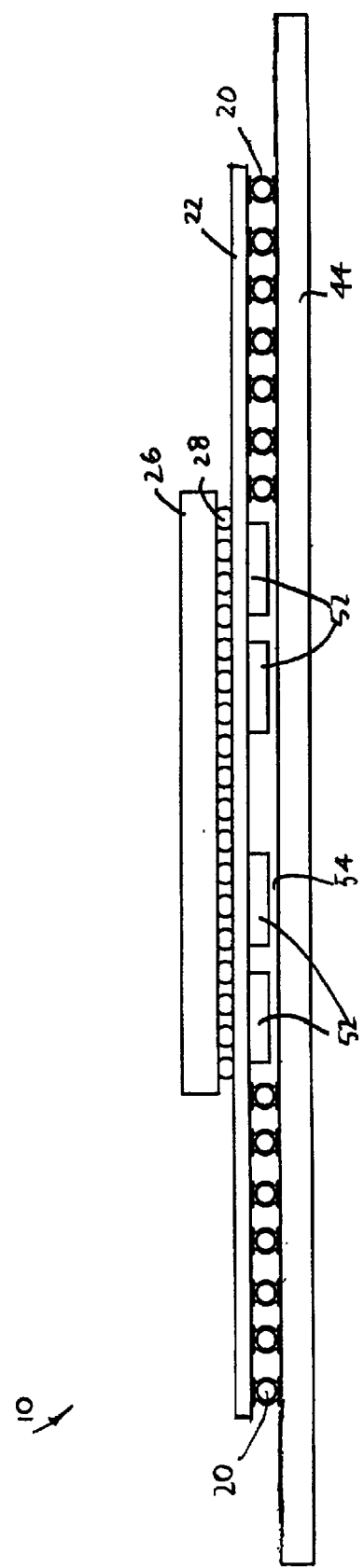
FIG. 1 is a side view illustrating an electronic assembly which is assembled according to the principles of the invention.

FIG. 1 of the accompanying drawings illustrates an electronic assembly 10 constructed according to the principles of the invention. The manner in which the electronic assembly 10 is constructed is now further described with reference to FIGS. 2 through 6.

Figure 2:
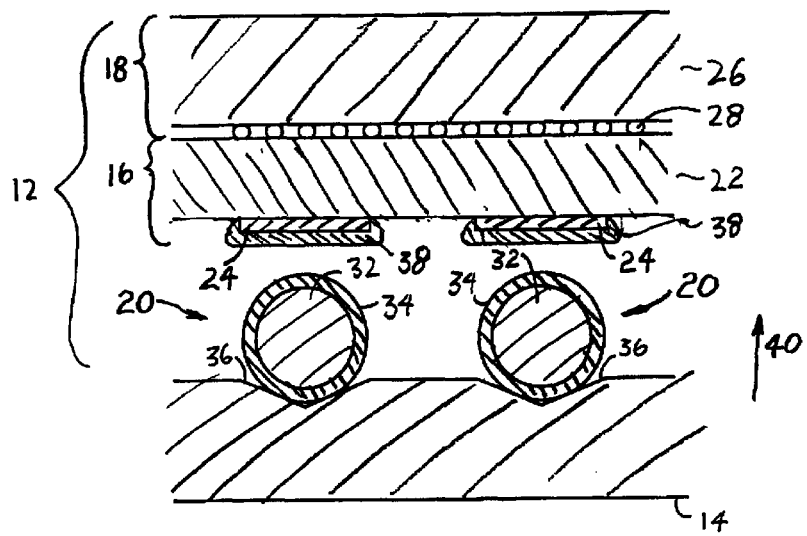
FIG. 2 is a side view illustrating electronic contacts located on a jig prior to attachment to contact pads on a package substrate.

FIG. 2 illustrates components of a partially constructed semiconductor assembly 12, together with a contact holding jig 14. The semiconductor assembly 12 includes a substrate subassembly 16, a semiconductor die subassembly 18, and electronic contacts 20.

The substrate subassembly 16 includes a package substrate 22, and a plurality of contact pads 24 on a lower surface of the package substrate 22. The package substrate 22 is a multilayer substrate, including alternating dielectric and metal lines (not shown). The contact pads 24 are made of metal, and are electrically connected to the metal lines. More contact pads (not shown) are formed on an upper surface of the package substrate 22. The contact pads on the upper surface of the package substrate 22 are also in electric communication with the metal lines, and through the metal lines with the contact pads 24.

The semiconductor die subassembly 18 includes a semiconductor die 26 and a plurality of electronic connections 28. The die 26 has an integrated circuit (not shown) formed in a lower surface thereof, and the electronic connections 28 are formed on terminals (not shown) on a lower surface of the integrated circuit. The electronic connections 28 are located on upper surfaces of the contact pads on the upper surface of the package substrate 22, and subsequently soldered to the contact pads in a thermal reflow process. The die 26 is thereby structurally secured through the electronic connections 28 to the package substrate 22. The contact pads 24 are also in electric communication through the metal lines in the package substrate 22 and the electronic connections 28 with the integrated circuit of the die 26.

Each electronic contact 20 has a spherical core 32 and an attachment layer 34 entirely surrounding the spherical core 32, i.e., uniformly located on all surfaces of the spherical core 32. In the preferred embodiment, the spherical core 32 is made of pure copper, and has a diameter of approximately 0.7 mm. In the preferred embodiment, the attachment layer 34 is made of a pure eutectic of tin and silver, comprising 3.5% silver by weight, and has a thickness of approximately 0.025 mm. Such electronic contacts may be obtained from Sumitomo Special Metals Co. Ltd. of Osaka, Japan.

Recesses 36 are formed in an upper surface of the jig 14. The recesses 36 are aligned with the contact pads 24, and a respective one of the electronic contacts 20 is located in a respective one of the recesses 36. Each electronic contact 20 is thereby aligned directly below a respective one of the contact pads 24.

The contact pads 24 have lower surfaces that are selectively stencil-printed with a solder flux 38. The jig 14 is subsequently moved vertically upward in a direction 40. The electronic contacts 20 move together with the jig 14 in the direction 40, and penetrate the solder flux 38.

Figure 3:
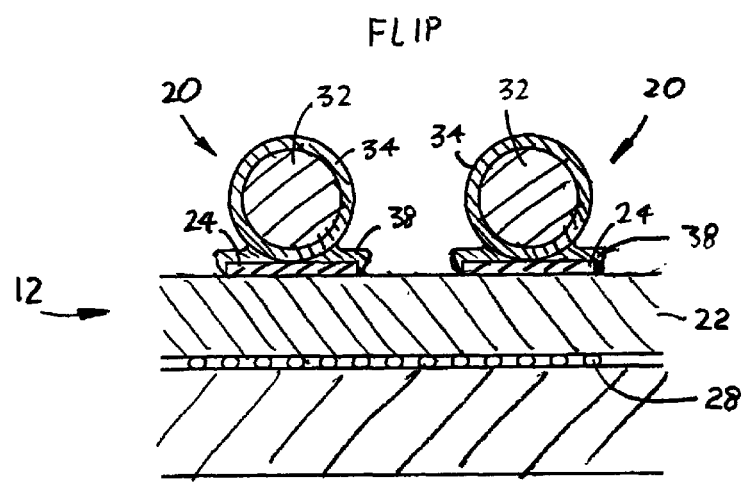
FIG. 3 is a view similar to FIG. 2 after the electronic contacts are brought into contact with the contact pads and the partial assembly is flipped so that the electronic contacts are at the top.

After the electronic contacts 20 and the contact pads 24 are brought together, the entire assembly is flipped so that the jig 14 is at the top. The jig 14 is then elevated to leave the electronic contacts 20 on the contact pads 24. FIG. 3 illustrates the semiconductor assembly 12 after the jig 14 is elevated. The viscous nature of the solder flux 38 prevents the electronic contacts 20 from rolling off the contact pads 24.

Figure 4:
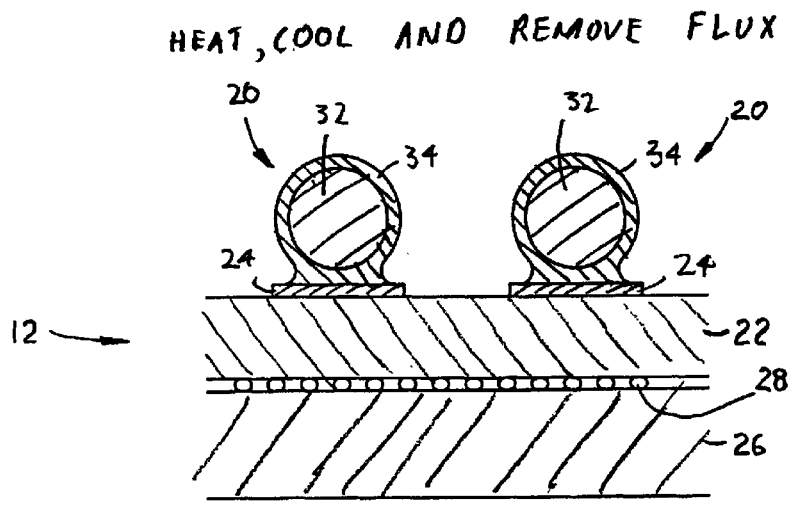
FIG. 4 is a view similar to FIG. 3 after heating, cooling, and removing of flux.

FIG. 4 illustrates the semiconductor assembly 12 of FIG. 3 after being heated, and subsequently cooled, and after removal of the flux 38. The semiconductor assembly 12 is heated to a temperature of approximately 230° C. The material of the layers 34 melts at approximately 227° C. The layers 34 wet over the contact pads 24. The spherical cores 32, being made of copper having a melting temperature of 1083° C., do not melt. Subsequent cooling of the semiconductor assembly 12 to below the melting temperature of the material of the layers 34 attaches the layers 34 to the contact pads 24.

Figure 5:
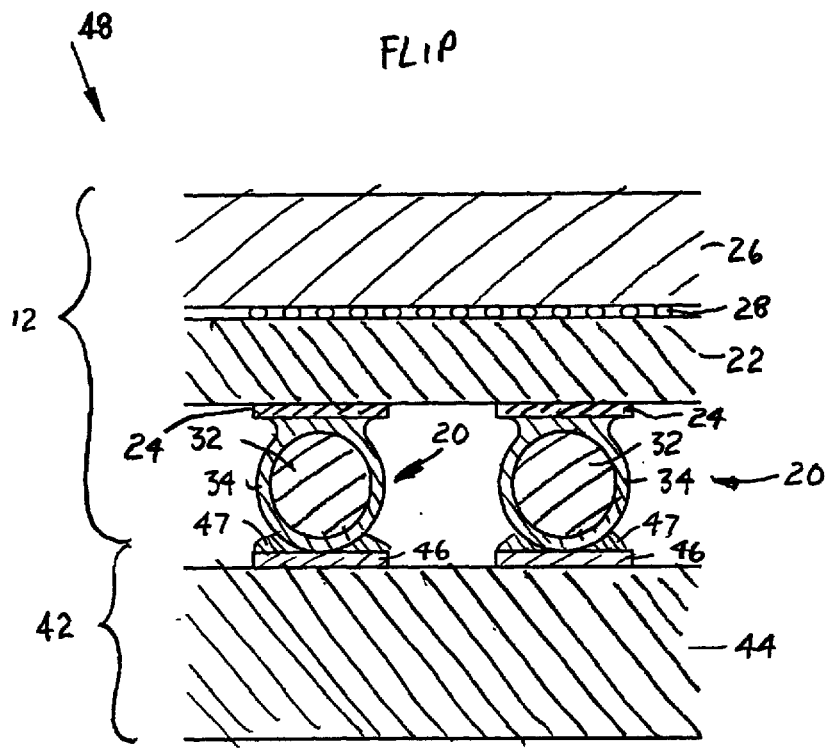
FIG. 5 is a view similar to FIG. 4 after the assembly of FIG. 4 is flipped so that the electronic contacts are at the bottom, and subsequently located on contact terminals of a board assembly.

As shown in FIG. 5, the semiconductor assembly 12 is subsequently flipped so that the electronic contacts 20 are at the bottom, and located on top of a board assembly 42. The board assembly 42 includes a printed circuit board 44 and contact terminals 46 formed on an upper surface of the printed circuit board 44. A flux 47 is stencil-printed on each contact terminal 46. A lower portion of each layer 34 penetrates the flux 47 and is located on a respective one of the contact terminals 46.

Figure 6:
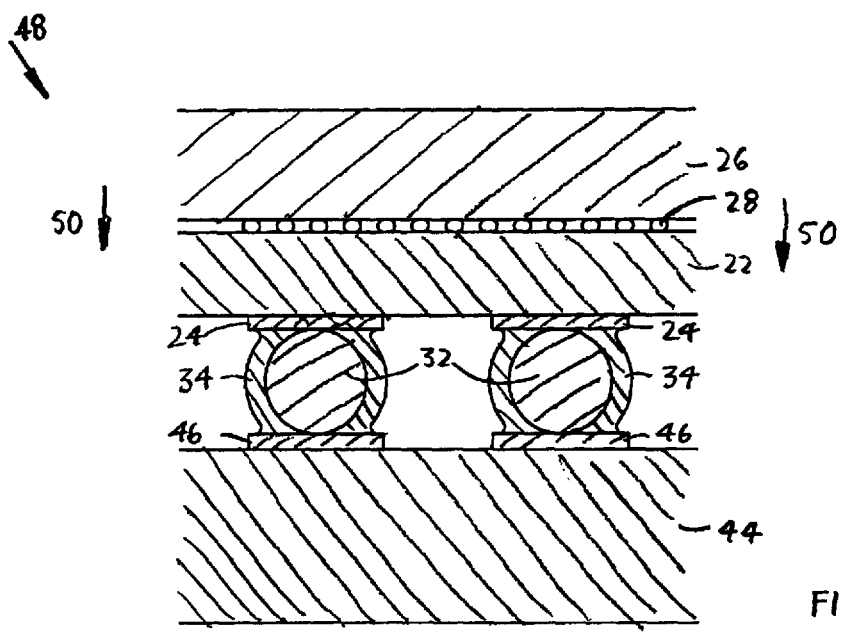
FIG. 6 is a view similar to FIG. 5 illustrating the electronic assembly of FIG. 5 after heating and cooling to attach attachment layers of the electronic contacts to the contact terminals while spherical cores of the electronic contacts serve as standoffs to control movement of the package substrate toward to the board assembly.

The partially manufactured electronic assembly 48 of FIG. 5 is then again heated to approximately 230° C., and cooled to room temperature. FIG. 6 illustrates the electronic assembly 48 after being heated and cooled. The temperature of 230° C. again melts the material of the layers 34, so that they wet over the contact terminals 46.

Melting of the layers 34 also causes a small amount of movement or "collapsing" of the package substrate 22 and the die 26 in a direction 50 toward the printed circuit board 44. The spherical cores 32 do not melt at the temperature of 230° C. The spherical cores 32 thus maintain their spherical shape throughout the reflow process, and act as standoffs that limit movement in a direction 50 until each spherical core 32 contacts a contact pad 24 and a contact terminal 46 on opposing sides thereof. The spherical cores 32 disallow further movement of the package substrate 22 in a direction 50 toward the printed circuit board 44. The remaining distance between opposing ones of the contact pads 24 and contact terminals 46 is thus limited by the diameter of the spherical core 32. Subsequent cooling of the electronic assembly 48 solidifies the attachment layers 34, and thereby secures them to the contact terminals 46 and the contact pads 24.

Each contact terminal 46 is secured to a respective contact pad 24 via a respective one of the layers 34. The contact terminal 46 is also electrically connected to the contact pad 24 via both the attachment layer 34 and the spherical core 32.

Referring again to FIG. 1, capacitors 52 are attached to the lower surface of the package substrate 22. The capacitors 52 are entirely surrounded by the electronic contacts 20. Each capacitor 52 has a lower surface which is spaced from the lower surface of the top of the package substrate 22 by a distance which is smaller than the spacing between the lower surface of the package substrate 22 and the upper surface of the printed circuit board 44. As such, a gap 54 is defined between a lower surface of each capacitor 52 and the upper surface of the printed circuit board 44. Contact between the capacitors 52 and the printed circuit board 44 is prevented by the spherical cores 32.

The diameter of the spherical cores 32 depends largely on the height of the capacitors 52. In other embodiments, the diameter of the spherical cores 32 may be between 0.5 and 0.8 mm. In other embodiments, the attachment layers 34 may be between 0.015 and 0.035 mm thick.

In another embodiment, a eutectic of tin and copper with 0.7% copper by weight may be used instead of the tin and silver eutectic of the layers 34. A tin and copper eutectic, however, has a melting temperature of 232° C., which is slightly higher than that of the tin and silver eutectic. The tin and silver eutectic is thus preferred over the tin and copper eutectic.

Another eutectic that may be used instead of the tin and silver eutectic of the layers 34 is a tin and lead eutectic, with 37% lead by weight. Such a tin and lead eutectic has a relatively low melting temperature of approximately 183° C. The disadvantage of such a eutectic is that it contains lead, which is environmentally undesirable. Alternatively, it may be possible to use pure tin for the attachment layer, but pure tin has a relatively high melting temperature.

Instead of copper, the spherical cores 32 may alternatively be made of silver. Coated silver spheres can be obtained from Seju Metal Industry Co. Ltd. in Tochigi, Japan. Silver is, however, toxic, and expensive when compared to copper. (The small amount of silver in the eutectic of the layers 34 is inconsequential.)

The spherical cores 32 may alternatively be made of a polymer. Polymer spheres can be obtained from Sekisui Chemical Co. Ltd. in Osaka, Japan. In the case of polymer spheres, the attachment layer 34 will provide the entire electric connection between the contact pads 24 and the contact terminals 46.

Aluminum or bronze may also be used as an alternative to copper for the spherical cores, although it may be difficult to form attachment layers on aluminum or bronze.

In all other embodiments, there is preferably at least a 30° C. temperature difference in melting temperatures of the cores and the attachment layers.

In the embodiment described, a jig is used to locate the contacts 20 shown in FIG. 2, and the assembly is then flipped as shown in FIG. 3. Another embodiment may use a vacuum chuck at the top to which contacts are held by a vacuum seal on the back. The contacts may then be dipped in flux. The vacuum chuck then moves the contacts into contact with a package substrate below.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. An electronic assembly comprising:
    a board;
    a plurality of contact terminals on an upper surface of the board;
    an electronic device, including an integrated circuit;
    a plurality of contact pads on a lower surface of the electronic device, each electrically connected to the integrated circuit;
    a plurality of standoff members, each attached to a lower surface of a respective contact pad;
    a plurality of attachment layers, each located on a respective standoff member, having a lower melting temperature that is at least 30° C. lower than a melting temperature of the respective standoff member, and being soldered to a respective upper surface of a respective contact terminal at a select temperature between the melting temperature of the standoff members and the attachment layers so that the standoff members resist movement of the electronic device toward the board when the attachment layers are melted; and
    a capacitor mounted to the electronic device and prevented from contacting the board by the standoff members.

2. The electronic assembly of claim 1, wherein the electronic component is located between the standoff members.

3. The electronic assembly of claim 1, wherein the electronic component is a capacitor.

4. The electronic assembly of claim 1, wherein the melting temperature of the respective attachment layer is below 232° C.

5. The electronic assembly of claim 1, wherein the respective attachment layer is selected from the group consisting of pure tin, a eutectic of tin and silver, and a eutectic of tin and copper.

6. The electronic assembly of claim 5, wherein the eutectic is a eutectic of tin and silver.

7. The electronic assembly of claim 1, wherein the respective attachment layer is free of lead.

8. The electronic assembly of claim 1, wherein the respective standoff member is free of lead.

9. The electronic assembly of claim 1, wherein the respective standoff member is substantially spherical and the respective attachment layer substantially surrounds the respective standoff member.

10. The electronic assembly of claim 9, wherein each respective attachment layer is soldered to a respective contact pad.

11. The electronic assembly of claim 9, wherein the respective standoff member is between 0.5 and 0.8 mm in diameter.

12. The electronic assembly of claim 11, wherein the respective attachment layer is between 0.015 and 0.035 mm thick.

13. The electronic assembly of claim 9, wherein the respective standoff member includes a material selected from the group consisting of aluminum, bronze, a polymer, silver, and copper.

14. The electronic assembly of claim 13, wherein the respective standoff member is made of substantially pure copper.

15. The electronic assembly of claim 1, wherein the electronic device includes a package substrate, the integrated circuit being mounted to an upper surface of the package substrate.

16. An electronic assembly, comprising:

a board;

a plurality of contact terminals on an upper surface of the board;

a package substrate;

an integrated circuit mounted on an upper surface of the package substrate;

a plurality of contact pads on a lower surface of the package substrate, each electrically connected through the package substrate to the integrated circuit;

a plurality of substantially spherical standoff members;

a plurality of attachment layers, each located around a respective standoff member, having a lower melting temperature is at least 30° C. lower than the respective standoff member, having an upper portion soldered to a respective contact pad, and having a lower portion soldered to a respective contact terminal at a select temperature between the melting temperature of the standoff members and the attachment layers so that the standoff members resist movement of the electronic device toward the board when the attachment layers are melted; and a capacitor mounted to the electronic device and prevented from contacting the board by the standoff members.

17. The electronic assembly of claim 16, wherein the respective standoff member includes a material selected from the group consisting of aluminum, bronze, a polymer, silver, and copper.

18. The electronic assembly of claim 17, wherein the respective attachment layers is selected from the group consisting of pure tin, a eutectic of tin and silver, and a eutectic of tin and copper.

19. A method of assembling an electronic assembly, comprising:

attaching a plurality of standoff components to respective contact pads of an electronic device, each standoff component having an attachment layer with at least a portion on a side thereof opposing the electronic device, the attachment layer being electrically connected through the contact pad to an integrated circuit of the electronic device and having a melting temperature that is at least 30° C. lower than a melting temperature of the standoff component;

mounting a component to the electronic device;

locating the portion of the attachment layer against a contact terminal on a board;

heating the portion so that the attachment layers melt without melting the standoff components so that the standoff components limit movement of the electronic device toward the board and prevent the component from contacting the board; and allowing the portion to cool to attach the portion to the contact terminal.

20. An electronic assembly comprising:

a board;

a plurality of contact terminals on an upper surface of the board;

a plurality of contact pads on a lower surface of the electronic device, each electrically connected to the integrated circuit;

a plurality of substantially spherical standoff members, each having a diameter of between 0.5 and 0.8 mm;

a plurality of attachment layers substantially surrounding each respective standoff member, having a melting temperature that is at least 30°C. lower than a melting temperature of the respective standoff member, and being soldered to a respective upper surface of a respective contact terminal at a select temperature between the melting temperature of the standoff members and the attachment layers so that the standoff members resist movement of the electronic device toward the board when the attachment layers are melted; and a capacitor mounted to the electronic device and prevented from contacting the board by the standoff members.

21. The electronic assembly of claim 20, wherein the respective attachment layer is between 0.015 and 0.035 mm thick.

* * * * *

UNITED STATES PATENT AND TRADEMARK OFFICE
CERTIFICATE OF CORRECTION

PATENT NO. : 7,053,491 B2 Page 1 of 1
APPLICATION NO. : 10/068494
DATED : May 30, 2006
INVENTOR(S) : Martin et al.

It is certified that error appears in the above-identified patent and that said Letters Patent is hereby corrected as shown below:

In column 4, at line 55, after "a" delete "lower".
In column 5, at line 54, after "a" deltee "lower".
In column 5, at line 55, after "temperature" insert --that--.
In column 6, at line 23, after "a" delete "component" insert --capacitor--.
In column 6, at line 29, after second occurrence "the" delete "component" insert --capacitor--.
In column 6, at line 36, after "board;" insert --an electronic device, including an integrated circuit;--.

Signed and Sealed this

Fourth Day of September, 2007

JON W. DUDAS
*Director of the United States Patent and Trademark Office*